US012685089B2

(12) United States Patent
Kikuchi et al.

(10) Patent No.: US 12,685,089 B2
(45) Date of Patent: Jul. 14, 2026

(54) ADHESIVE SHEET, PRODUCTION METHOD FOR ADHESIVE SHEET, ROLL, AND PRODUCTION METHOD FOR CONNECTION STRUCTURE

(71) Applicant: Resonac Corporation, Tokyo (JP)

(72) Inventors: Kenta Kikuchi, Tokyo (JP); Hiroyuki Izawa, Tokyo (JP); Takashi Tatsuzawa, Tokyo (JP); Mayumi Sato, Tokyo (JP); Yasuo Maehara, Tokyo (JP); Hiroshi Takaira, Tokyo (JP); Takahiro Fukui, Tokyo (JP); Katsuhiko Tomisaka, Tokyo (JP); Toshiaki Matsuzaki, Tokyo (JP)

(73) Assignee: Resonac Corporation, Tokyo (JP)

( * ) Notice: Subject to any disclaimer, the term of this patent is extended or adjusted under 35 U.S.C. 154(b) by 58 days.

(21) Appl. No.: 18/683,052

(22) PCT Filed: Aug. 9, 2022

(86) PCT No.: PCT/JP2022/030473
§ 371 (c)(1),
(2) Date: Mar. 22, 2024

(87) PCT Pub. No.: WO2023/022076
PCT Pub. Date: Feb. 23, 2023

(65) Prior Publication Data
US 2024/0355665 A1 Oct. 24, 2024

(30) Foreign Application Priority Data
Aug. 16, 2021 (JP) ................................. 2021-132400

(51) Int. Cl.
*H10P 72/70* (2026.01)
*C09J 7/40* (2018.01)
*C09J 9/02* (2006.01)

(52) U.S. Cl.
CPC .......... *H10P 72/7402* (2026.01); *C09J 7/403* (2018.01); *C09J 9/02* (2013.01); *C09J 2203/326* (2013.01);
(Continued)

(58) Field of Classification Search
CPC ....... H01L 21/6836; H01L 2221/68318; H01L 2221/68386; H01L 2221/68327;
(Continued)

(56) References Cited

U.S. PATENT DOCUMENTS

2019/0241771 A1* 8/2019 Tatsuzawa ............... H01B 5/16

FOREIGN PATENT DOCUMENTS

CN 109878096 A * 6/2019
JP H9-003409 A 1/1997
(Continued)

OTHER PUBLICATIONS

CN109878096A Machine Translation of Description (Year: 2025).*
WO00/25265A1 Machine Translation of Description (Year: 2025).*

*Primary Examiner* — Cynthia L Schaller
(74) *Attorney, Agent, or Firm* — FITCH, EVEN, TABIN & FLANNERY, LLP

(57) ABSTRACT

A production method for an adhesive sheet for semiconductor device production including: preparing a backing material-attached laminated body including a laminated body and a backing material; a laminated body cutting step of making an incision in the laminated body along any cut-out shape; and a backing material peeling step of peeling the backing material from the laminated body, wherein in the backing material peeling step, a portion of the laminated body existing in a region surrounded by the incision is attached to the backing material and removed.

10 Claims, 9 Drawing Sheets

(52) U.S. Cl.
    CPC ...... *C09J 2301/122* (2020.08); *C09J 2301/18*
    (2020.08); *C09J 2301/50* (2020.08); *H10P*
    *72/7412* (2026.01); *H10P 72/7442* (2026.01)

(58) Field of Classification Search
    CPC . H01L 2221/68377; H01L 2221/68381; H01L
    21/60; H01L 23/29; C09J 7/403; C09J
    9/02; C09J 2203/326; C09J 2301/122;
    C09J 2301/18; C09J 2301/50; C09J
    2301/314; C09J 201/00; C09J 7/30; C09J
    7/20; C09J 2301/20; H01R 43/00; H01R
    4/04; H01R 11/01; H05K 3/32; H05K
    3/321
    See application file for complete search history.

(56)                 References Cited

FOREIGN PATENT DOCUMENTS

| JP | 2011-179013 | A | | 9/2011 |
|----|-------------|---|---|--------|
| JP | 2013-207115 | A | | 10/2013 |
| WO | WO00/25265 | A1 | * | 5/2000 |
| WO | 2018/066411 | A1 | | 4/2018 |

* cited by examiner (a)

(b)

(c)

(d)

(a)

(b)

(c)

(d)

(a)

(b)

(c)

ADHESIVE SHEET, PRODUCTION METHOD FOR ADHESIVE SHEET, ROLL, AND PRODUCTION METHOD FOR CONNECTION STRUCTURE

TECHNICAL FIELD

The present disclosure relates to an adhesive sheet, a production method for the adhesive sheet, and a production method for a roll and a connected structure.

BACKGROUND ART

Various adhesives have been hitherto used for fixing electronic components used in semiconductor devices, connecting circuits, and the like. A film-shaped adhesive (adhesive film) is known as an example of the use application of such an adhesive. An adhesive film is usually formed on a release film called a separator and is provided in the form of an adhesive sheet in which the release film and the adhesive film are integrated. In a case where a first member and a second member are connected using an adhesive sheet, the adhesive sheet is stuck to an adhesive surface of the first member from the adhesive film side, subsequently the release film is peeled off, and the adhesive surface of the first member and an adhesive surface of the second member are superposed, with the adhesive film interposed therebetween.

As the adhesive film, for example, there is known a conductive adhesive film to which electrical conductivity is imparted by dispersing conductive particles in an adhesive (for example, Patent Literature 1). According to such a conductive adhesive film, electronic components can be electrically connected to each other.

CITATION LIST

Patent Literature

Patent Literature 1: Japanese Unexamined Patent Publication No. 2013-207115

SUMMARY OF INVENTION

Technical Problem

In recent years, there have been demands for higher functionality, higher integration, higher speed, and the like for semiconductor devices. Along with this, the shape of the adhesive surfaces of electronic components (for example, a semiconductor chip and a wiring circuit board) that are connected through adhesive films has become more complicated, and protruding parts such as pillars, ICs, protective films, solder balls, and multistage electrodes are formed in the vicinity of sites on the adhesive surface where the adhesive film is provided.

However, due to the nature of the tape being cut and stuck, conventional adhesive films can be stuck only onto a rectangular-shaped adhesive surface having the same width as the film. In addition, when there are protruding parts on the adhesive surface, the adhesive may be attached even to the protruding parts. When the adhesive is attached even to the protruding parts, air bubbles are likely to be trapped, causing poor adhesion. Furthermore, as a result of studies conducted by the inventors of the present disclosure, it has become clear that even when unnecessary portions of the adhesive film are removed in advance, wrinkles may occur in the adhesive film due to the release film being pushed up by the protruding parts, and problems such as formation of gaps between the adhesive film and the adhesive surface are likely to occur.

Thus, it is an object of the present disclosure to provide an adhesive sheet for semiconductor device production which, even when an adhesive surface has a protruding part, can be conveniently stuck to the periphery of the protruding part, and a production method for the adhesive sheet.

Solution to Problem

The inventors of the present disclosure came up with an idea of improving the stickiness of an adhesive sheet to the periphery of a protruding part by cutting out a site of the adhesive sheet that will be located on the protruding part at the time of sticking the adhesive sheet to an adhesive surface. However, it has become clear that in adhesive sheets for semiconductor device production, residual foreign matter (chips from the adhesive film and the release film) generated due to cutting out, curling of the adhesive film in the cut-out portion, and the like may cause problems such as bleeding out of resins and peeling of individual pieces. Thus, the inventors of the present disclosure conducted an investigation on a method for preventing remaining of foreign matter and curling of the adhesive film as described above, and as a result, the inventors found that it is possible to cut out a fine shape while preventing remaining of foreign matter and curling of an adhesive film, by a method of cutting out an adhesive sheet in a state of being provided with a base material tape on the back surface thereof, thus completing the present disclosure.

An aspect of the present disclosure relates to a production method for an adhesive sheet for semiconductor device production including a release film and an adhesive film provided on the release film, the production method including: a preparation step of preparing a backing material-attached laminated body including a laminated body and a backing material, the laminated body including the release film and an adhesive film layer provided on the release film, and the backing material being stuck to the release film side of the laminated body; a laminated body cutting step of making an incision in the laminated body along any cut-out shape; and a backing material peeling step of peeling the backing material from the laminated body. In this method, in the backing material peeling step, a portion of the laminated body existing in a region surrounded by the incision is attached to the backing material and removed.

According to the production method according to the above-described aspect, an adhesive sheet which, even when an adhesive surface has a protruding part, can be conveniently stuck to the periphery of the protruding part, can be provided. In addition, according to the production method according to the above-described aspect, foreign matter originating from adhesive film pieces and release film pieces that are removed in the backing material peeling step is less likely to remain, and curling of the adhesive film in the removed portion (cut-out portion) is also less likely to occur.

The production method according to the above-described aspect may include: an adhesive film layer cutting step of making an incision in the adhesive film layer along an outline forming an outer shape of the adhesive film; and a margin peeling step of peeling, from the release film, a portion other than the portion removed in the backing material peeling step, in a margin portion constituting a portion other than the adhesive film in the adhesive film layer. According to this method, since the outer shape of the adhesive film can be changed along the shape of the adhesive surface, stickiness of the adhesive sheet is further improved. Furthermore, when using the adhesive sheet, only a portion of the adhesive on the release film may be utilized, so that the remaining portion of the adhesive may become useless; however, according to this method, the adhesive film can be effectively utilized, and the material cost can be suppressed.

The above-described adhesive film may be a conductive adhesive film containing conductive particles. In a conductive adhesive film containing conductive particles, generally, an adhesive that can flow at the time of connection is used from the viewpoint of reducing connection resistance. Therefore, in a conductive adhesive film, re-fusion of the adhesive may occur after incisions are made; however, in the above-described production method, since the incisions reach to the release film, even in a case where re-fusion of the adhesive occurs, adhesive film pieces can be removed together with release film pieces by peeling the backing material.

Another aspect of the present disclosure relates to an adhesive sheet for semiconductor device production, the adhesive sheet including a release film and an adhesive film provided on one principal surface of the release film, in which the release film has a through-hole penetrating in a thickness direction, while the adhesive film is formed around an opening on the principal surface side of the through-hole such that the opening is exposed when viewed from the thickness direction, or the release film has a notch part in a part of a peripheral edge portion, while the adhesive film is formed around the notch part when viewed from the thickness direction.

According to the adhesive sheet according to the above-described aspect, even when the adhesive surface has a protruding part, sticking to the periphery of the protruding part can be conveniently performed.

The above-described release film may be long, and a plurality of the above-described adhesive films may be arranged along the longitudinal direction of the release film.

The above-described adhesive film may be a conductive adhesive film containing conductive particles.

Another aspect of the present disclosure relates to a roll including the adhesive sheet according to the above-described aspect and a winding core around which the adhesive sheet is wound.

Another aspect of the present disclosure relates to a production method for a connected structure, the production method including: a preparation step of preparing the adhesive sheet according to the above-described aspect; a transfer step of sticking the adhesive film of the adhesive sheet to a first adhesive surface of a first member; and a connection step of connecting the first adhesive surface of the first member and a second adhesive surface of a second member, with the adhesive film interposed therebetween. In this method, the first member has a protruding part on the first adhesive surface, in the transfer step, positioning of the adhesive sheet is performed such that the opening in the release film and the protruding part in the first member are superposed when viewed in a plan view, and sticking the adhesive film to the first adhesive surface of the first member such that the adhesive film is not attached to the protruding part; or alternatively, positioning of the adhesive sheet is performed such that the notch part in the release film is located around the protruding part in the first member when viewed in a plan view, and sticking the adhesive film to the first adhesive surface of the first member such that the adhesive film is not attached to the protruding part.

Advantageous Effects of Invention

Thus, it is a main object of the present disclosure to provide an adhesive sheet which, even when an adhesive surface has a protruding part, can be conveniently stuck to the periphery of the protruding part, and a production method for the adhesive sheet.

BRIEF DESCRIPTION OF DRAWINGS

FIG. 5 is a schematic cross-sectional view for describing a production method for the adhesive sheet shown in FIG. 1.

FIG. 6 is a perspective view for describing the production method for the adhesive sheet shown in FIG. 1.

FIG. 7 is a schematic cross-sectional view illustrating a connected structure according to an embodiment.

FIG. 8 is a schematic cross-sectional view illustrating a production method for the connected structure shown in FIG. 7.

FIG. 9 is a perspective view illustrating a roll according to an embodiment.

DESCRIPTION OF EMBODIMENTS

Figure 1:
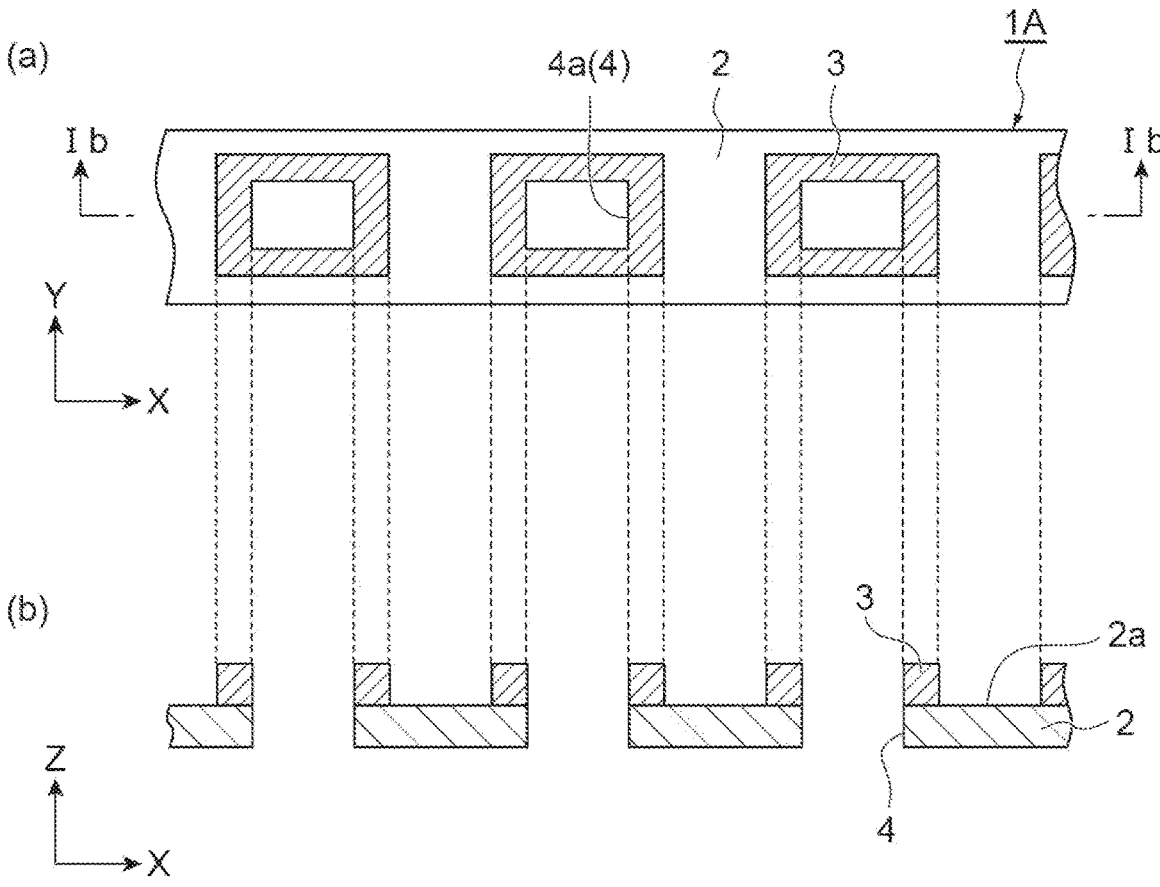
[FIG. 1] Part (a) of FIG. 1 is a plan view illustrating an adhesive sheet according to an embodiment, and part (b) of FIG. 1 is a schematic end view taken along line Ib-Ib shown in part (a) of FIG. 1.

The present disclosure provides at least the following [1] to [14].

[1] A production method for an adhesive sheet for semiconductor device production including a release film and an adhesive film provided on the release film, the production method including:

a preparation step of preparing a backing material-attached laminated body including a laminated body and a backing material, the laminated body including the release film and an adhesive film layer provided on the release film, and the backing material being stuck to the release film side of the laminated body;

a laminated body cutting step of making an incision in the laminated body along any cut-out shape; and a backing material peeling step of peeling the backing material from the laminated body, in which in the backing material peeling step, a portion of the laminated body existing in a region surrounded by the incision is attached to the backing material and removed.

[2] The production method for an adhesive sheet according to [1], further including:

an adhesive film layer cutting step of making an incision in the adhesive film layer along an outline forming an outer shape of the adhesive film; and a margin peeling step of peeling, from the release film, a portion other than the portion removed in the backing material peeling step, in a margin portion constituting a portion other than the adhesive film in the adhesive film layer.

[3] The production method for an adhesive sheet according to [1] or [2], in which the adhesive film is a conductive adhesive film containing conductive particles.

[4] An adhesive sheet for semiconductor device production, the adhesive sheet including:

a release film; and an adhesive film provided on one principal surface of the release film, in which the release film has a through-hole penetrating in a thickness direction, and the adhesive film is formed around an opening on the principal surface side of the through-hole such that the opening is exposed when viewed from the thickness direction.

[5] The adhesive sheet according to [4], in which the release film is long, and a plurality of the adhesive films are arranged along a longitudinal direction of the release film.

[7] The adhesive sheet according to [4] or [5], in which the adhesive film is a conductive adhesive film containing conductive particles.

[8] An adhesive sheet for semiconductor device production, the adhesive sheet including:

a release film; and an adhesive film provided on one principal surface of the release film, in which the release film has a notch part in a part of a peripheral edge portion, and the adhesive film is formed around the notch part when viewed from the thickness direction.

[9] The adhesive sheet according to [8], in which the release film is long, and a plurality of the adhesive films are arranged along a longitudinal direction of the release film.

[10] The adhesive sheet according to [8] or [9], in which the adhesive film is a conductive adhesive film containing conductive particles.

[11] A roll including:

the adhesive sheet according to any one of [4] to [10]; and a winding core around which the adhesive sheet is wound.

[12] A production method for a connected structure, the production method including:

a preparation step of preparing the adhesive sheet according to any one of [4] to [7];

a transfer step of sticking the adhesive film of the adhesive sheet to a first adhesive surface of a first member; and a connection step of connecting the first adhesive surface of the first member and a second adhesive surface of a second member, with the adhesive film interposed therebetween, in which the first member has a protruding part on the first adhesive surface, in the transfer step, positioning of the adhesive sheet is performed such that the opening in the release film and the protruding part in the first member are superposed when viewed in a plan view, and sticking the adhesive film to the first adhesive surface of the first member such that the adhesive film is not attached to the protruding part.

[13] A production method for a connected structure, the production method including:

a preparation step of preparing the adhesive sheet according to any one of [8] to [10];

a transfer step of sticking the adhesive film of the adhesive sheet to a first adhesive surface of a first member; and a connection step of connecting the first adhesive surface of the first member and a second adhesive surface of a second member, with the adhesive film interposed therebetween, in which the first member has a protruding part on the first adhesive surface, in the transfer step, positioning of the adhesive sheet is performed such that the notch part in the release film is located around the protruding part in the first member when viewed in a plan view, and sticking the adhesive film to the first adhesive surface of the first member such that the adhesive film is not attached to the protruding part.

[14] A connected structure including:

a first member having a first adhesive surface;

a second member having a second adhesive surface; and a connecting part connecting the first adhesive surface and the second adhesive surface, in which the first member has a protruding part on the first adhesive surface, and the connecting part is formed from an adhesive film of the adhesive sheet according to one of [4] to [10] or a cured product of the adhesive film, and is formed at least around the protruding part in the first member when viewed in a plan view.

Hereinafter, suitable embodiments of the present disclosure will be described in detail with reference to the drawings. In the drawings, the same or corresponding portions will be assigned with the same reference numerals, and any redundant description will not be repeated. In the drawings, dimensional proportions and the like are changed as appropriate in order to make the description easier to understand. In the present specification, a numerical value range expressed by using the term "to" indicates a range including the numerical values described before and after the term "to" as the minimum value and the maximum value, respectively. With regard to numerical value ranges described stepwise in the present specification, the upper limit value or lower limit value of a numerical value range in a certain stage may be replaced with the upper limit value or lower limit value of a numerical value range of another stage.

Adhesive Sheet

Part (a) of FIG. 1 is a plan view illustrating an adhesive sheet according to an embodiment, and part (b) of FIG. 1 is a schematic end view taken along line Ib-Ib shown in part (a) of FIG. 1. As shown in FIG. 1, an adhesive sheet 1A according to an embodiment includes a release film 2 and an adhesive film 3 provided on one principal surface 2a of the release film 2. The adhesive sheet 1A is used by sticking the adhesive film 3 to an adhesive surface of a target of adhesion. In a plan view, the outer shape of the adhesive sheet 1A is defined by the outer shape of the release film 2.

The release film 2 is a long film extending in one direction (X-direction in part (a) of FIG. 1). The release film 2 is also called a carrier film. The release film 2 supports the adhesive film 3 by being stuck to the adhesive film 3. The release film 2 may be a resin film formed of polyethylene terephthalate (PET), polyethylene, polypropylene, or the like. The surface (principal surface 2a) of the release film 2 where the adhesive film 3 is provided may be subjected to a mold release treatment, a plasma treatment, or the like. The length in the longitudinal direction (X-direction shown in part (a) of FIG. 1) of the release film 2 may be, for example, 1 to 400 m. The length in the transverse direction (Y-direction shown in part (a) of FIG. 1) of the release film 2 may be, for example, 5 to 300 mm. The thickness of the release film 2 may be, for example, 5 to 200 μm.

Meanwhile, when the adhesive film 3 is stuck to an adhesive surface (not shown in the drawing) of a target of adhesion with high precision, it is necessary to specify the position of the adhesive film 3 in the adhesive sheet 1A. Thus, it is conceivable to detect the position of the adhesive film 3 in the adhesive sheet 1A using an image pickup device. However, when considering that the adhesive film 3 is stuck to the adhesive surface afterwards, it is preferable that the image pick-up device is disposed on the release film 2 side. Thus, the release film 2 may have optical transparency so that the position of the adhesive film 3 can be detected from the release film 2 side using an image pick-up device. In this case, the transmittance of the release film 2 can be set to 15% or higher and 100% or lower, preferably set to 15% or higher and 99% or lower, and more preferably set to 16% or higher and 98% or lower. The transmittance of the release film 2 is obtained by setting the release film cut into a square having a size of 50 mm×50 mm on a haze meter (for example, NDH-5000 manufactured by NIPPON DEN-SHOKU INDUSTRIES CO., LTD.) and measuring the total light transmittance.

The haze value of the release film 2 can be set to 3% or higher and 100% or lower, preferably set to 3% or higher and 99% or lower, and more preferably 4% or higher and 99% or lower. The haze value of the release film 2 is obtained by setting the release film cut into a square having a size of 50 mm×50 mm on a haze meter (for example, NDH-5000 manufactured by NIPPON DENSHOKU INDUSTRIES CO., LTD.) and measuring the haze value.

The release film 2 may have an alignment mark so that the position of the adhesive film 3 can be detected from the release film 2 side using an image pick-up device.

The release film 2 has a through-hole 4 that penetrates in the thickness direction (Z-direction shown in part (b) of FIG. 1 (direction orthogonally intersecting the X-direction and the Y-direction)). The through-hole 4 is formed such that when the adhesive sheet 1A is stuck to an adherend (an electronic component or the like), a protruding part formed on the adhesive surface of the adherend can be exposed through the through-hole 4. The opening shape of the through-hole 4 in FIG. 1 is a rectangular shape; however, the opening shape may be a shape corresponding to the outer shape (planar shape) of the protruding part formed on the adhesive surface of the adherend, may be a regular shape such as a polygonal shape, a circular shape, or an elliptical shape, or may be an irregular shape. In addition, the size and the number of the through-holes 4 can also be changed as appropriate according to the size and the number of the protruding parts formed on the adhesive surface of the adherend.

Regarding the adhesive film 3, a plurality of them are arranged along the longitudinal direction (X-direction) of the release film 2. The plurality of the adhesive films 3 are separated apart from each other in the longitudinal direction of the release film 2. The interval between adjacent adhesive films 3, 3 (shortest distance in the X-direction) may be 0.1 mm or more, 0.5 mm or more, 0.8 mm or more, 1 mm or more, or 3 mm or more, and may be 5 mm or less, 8 mm or less, 10 mm or less, or 30 mm or less. All the adhesive films 3 may be arranged at constant intervals, or the adhesive films 3 may be arranged at different intervals.

The adhesive film 3 is formed around an opening 4a such that the opening 4a on the principal surface 2a side of the through-hole 4 is exposed when viewed from the thickness direction (Z-direction). As a result, when the adhesive sheet 1A is stuck to an adherend (electronic component or the like), a protruding part formed on the adhesive surface of the adherend can be exposed through the through-hole 4 of the release film 2, and after peeling of the release film 2, the adhesive film 3 can be provided around the protruding part without having the adhesive attached to the protruding part.

The length in the longitudinal direction (X-direction) of the release film 2 of the adhesive film 3 may be, for example, 0.1 to 20 mm. The length in the transverse direction (Y-direction) of the release film 2 of the adhesive film 3 is smaller than the length in the transverse direction of the release film 2 and may be, for example, 5 to 80 mm. The length in the transverse direction (Y-direction) of the release film 2 of the adhesive film 3 may be the same as the length in the transverse direction (Y-direction) of the release film 2. The thickness of the adhesive film 3 may be, for example, 0.001 to 10 mm.

The adhesive constituting the adhesive film 3 is, for example, a conductive adhesive containing an adhesive component and conductive particles. The conductive particles are, for example, dispersed in the adhesive component such that the adhesive film 3 has anisotropic conductivity.

The adhesive component may be, for example, a thermosetting or photocurable adhesive component. The thermosetting or photocurable adhesive component may include, for example, a curable resin such as a cationically polymerizable compound, an anionically polymerizable compound, or a radically polymerizable compound. The cationically polymerizable compound and the anionically polymerizable compound may include an epoxy resin, a vinyl ether resin, or an oxetane resin. The adhesive component contains a curable resin and a curing agent and may further contain a thermoplastic resin, a coupling agent, a filler, and the like as necessary.

Examples of the epoxy resin include a bisphenol A type epoxy resin, a bisphenol S type epoxy resin, a bisphenol F type epoxy resin, a phenol novolac type epoxy resin, a cresol novolac type epoxy resin, a bisphenol A novolac type epoxy resin, a bisphenol F novolac type epoxy resin, a tetramethyl bisphenol A type epoxy resin, 3',4'-epoxycyclohexylmethyl-3,4-epoxycyclohexane carboxylate (bi-7-oxabicyclo[4,1,0]heptane), 3,4-epoxycyclohexylmethyl (meth)acrylate, (3,3', 4,4'-diepoxy)bicyclohexyl, dicyclopentadiene dimethanol diglycidyl ether, xylene-novolac type glycidyl ether, and a biphenyl type epoxy resin. The epoxy compound may include at least one selected from the group consisting of a bisphenol A type epoxy resin, a tetramethyl bisphenol A type epoxy resin, dicyclopentadiene dimethanol diglycidyl ether, xylene-novolac type glycidyl ether, and an alicyclic epoxy resin. The epoxy compound may include a glycidyl ether-based compound.

Regarding the oxetane resin, any resin having one or more oxetane ring structures in the molecule can be used without particular limitation.

The curing agent is not particularly limited as long as it can cure a cationically polymerizable compound or an anionically polymerizable compound, and examples thereof include an anionically polymerizable catalyst type curing agent, a cationically polymerizable catalyst type curing agent, and a polyaddition type curing agent. The content of the curing agent may be 0.05 to 20 parts by mass with respect to 100 parts by mass of the total amount of the curable resin and the thermoplastic resin that is blended as necessary.

The anionically or cationically polymerizable catalyst type curing agent may be, for example, an imidazole-based agent, a hydrazide-based agent, a boron trifluoride-amine complex, an onium salt (an aromatic sulfonium salt, an aromatic diazonium salt, an aliphatic sulfonium salt, a pyridium salt, or the like), amineimide, diaminomaleonitrile, melamine and a derivative thereof, a salt of polyamine, or dicyandiamide, or may be these of modification products. Examples of the polyaddition type curing agent include polyamine, polymercaptan, polyphenol, and acid anhydride.

The radically polymerizable compound may be, for example, a compound having a functional group that is polymerized by a radical. The radically polymerizable compound may be, for example, an acrylate (also including corresponding methacrylate; hereinafter, the same) compound, a (meth)acrylic acid compound, an acryloxy (also including corresponding methacryloxy; hereinafter, the same) compound, a maleimide compound, a citraconimide resin, or a nadimide resin. These may be used in the form of either a monomer or an oligomer, or a monomer and an oligomer may be used in combination. Regarding the radically polymerizable compounds, one kind thereof may be used alone, or two or more kinds thereof may be used in combination.

Examples of the acrylate compound include methyl acrylate, ethyl acrylate, isopropyl acrylate, isobutyl acrylate, ethylene glycol diacrylate, diethylene glycol diacrylate, trimethylolpropane triacrylate, tetramethylolmethane tetraacrylate, 2-hydroxy-1,3-diacryloxypropane, 2,2-bis[4-(acryloxymethoxy)phenyl]propane, 2,2-bis[4-(acryloxypolyethoxy)phenyl]propane, dicyclopentenyl acrylate, tricyclodecanyl acrylate, tris(acryloyloxyethyl) isocyanurate, urethane acrylate, and phosphoric acid ester diacrylate.

The radical polymerization initiator may be, for example, a compound that is decomposed by heating or irradiation with light to generate free radicals. The radical polymerization initiator may be, for example, a peroxide compound or an azo-based compound. The radical polymerization initiator is preferably diacyl peroxide, peroxydicarbonate, peroxy ester, peroxy ketal, dialkyl peroxide, hydroperoxide, and silyl peroxide. The content of the radical polymerization initiator may be 0.1 to 10 parts by mass with respect to 100 parts by mass of the total amount of the radically polymerizable compound and a thermoplastic resin that is blended as necessary.

The thermoplastic resin that is blended with the thermosetting or photocurable adhesive component as necessary includes a phenoxy resin, a polyvinyl formal resin, a polystyrene resin, a polyvinyl butyral resin, a polyester resin, a polyamide resin, a xylene resin, a polyurethane resin, a polyester urethane resin, a phenol resin, and a terpene phenol resin.

In a case where the thermoplastic resin is blended with a thermosetting adhesive component, the content of the thermoplastic resin may be 5 to 80 parts by mass with respect to 100 parts by mass of the total amount of the thermosetting resin and the thermoplastic resin. In a case where the thermoplastic resin is blended with a photocurable (radical-curable) adhesive component, the content of the thermoplastic resin may be 5 to 80 parts by mass with respect to 100 parts by mass of the total amount of the radically polymerizable compound and the thermoplastic resin.

The content of the adhesive component may be 75 to 98% by volume based on the total volume of the adhesive.

Regarding the conductive particles, for example, metal particles of Au, Ag, Ni, Cu, Pd, and solder, and carbon particles are used. In addition, the conductive particles may be particles obtained by coating the surface of transition metals such as Ni and Cu with noble metals such as Au and Pd. Furthermore, the conductive particles may be coated conductive particles having a non-conductive core formed of a non-conductive material such as glass, a ceramic, or a resin (an acrylic resin, a styrene resin, silicone, or the like) and a conductive layer coating the surface of the core. In this case, the conductive layer may be formed of, for example, gold, silver, copper, nickel, palladium, or an alloy of these. The conductive particles may also be particles having an outermost layer composed of a noble metal, particles using heat-melting metal particles, or the like. The average particle size of the conductive particles may be, for example, 1 to 50 μm. The average particle size is measured by using a particle size distribution analyzer (Microtrac (product name, Nikkiso Co., Ltd.)) using a laser diffraction and scattering method. The conductive particles may have, for example, an approximately spherical shape.

The conductive particles may have an anisotropic shape. The term "anisotropic shape" according to the present specification refers to shape anisotropy and implies that the shape is not an approximately point-symmetric (approximately isotropic) shape (for example, a spherical shape). The conductive particles having an anisotropic shape may have a dendrite shape (also referred to as a dendritic shape) or a flake shape. The conductive particles having an anisotropic shape may be formed of a metal such as copper or silver or may be, for example, silver-coated copper particles obtained by coating copper particles with silver. Regarding the conductive particles, one kind thereof may be used alone, or two or more kinds thereof may be used in combination.

The content of the conductive particles in the adhesive may be 2 to 70% by volume based on the total volume of the adhesive. The adhesive does not have to contain conductive particles.

The adhesive sheet 1A can be applied to various adhesive sheets for semiconductor device production. Specifically, for example, the adhesive sheet 1A can be used in use applications for connection of circuit members (for example, connection between a semiconductor chip and a wiring circuit board or another semiconductor chip).

In the adhesive sheet 1A described above, since the release film 2 has a through-hole 4, and the adhesive film 3 is formed around the opening 4a when viewed in a plan view, even in a case where the adherend has a protruding part on the adhesive surface, the adhesive film 3 can be stuck to the periphery of the protruding part without attaching the adhesive to the protruding part, by positioning the adhesive film 3 such that the protruding part and the through-hole 4 are superposed when viewed in a plan view. In addition, since the shape of the adhesive film 3 can be arbitrarily set according to the shape of the adhesive surface of the adherend, the adhesive film 3 can be effectively utilized for various adhesive surfaces of adherends.

As described above, the adhesive sheet according to an embodiment has been described; however, the adhesive sheet of the present disclosure is not limited to the above-described embodiment.

For example, the adhesive sheet may further include a cover film on a surface of the adhesive film 3, the surface being on the opposite side of the release film 2. The cover film may have the same size and shape as the size and shape of the release film 2. The cover film may be provided only on the adhesive film 3.

In the above-described embodiment, a plurality of the adhesive films 3 are separated apart from each other in the longitudinal direction of the release film 2; however, the adhesive film 3 may be continuous in the longitudinal direction (X-direction) of the release film 2. Furthermore, in the above-described embodiment, the release film 2 is long, and a plurality of the adhesive films 3 are arranged along the longitudinal direction (X-direction) of the release film 2; however, one adhesive film may be formed on a principal surface of a release film having a rectangular outer shape.

Furthermore, in the above-described embodiment, the adhesive film 3 is disposed at the central part in the transverse direction (Y-direction) of the release film 2; however, a plurality of the adhesive films 3 may be disposed at any locations in the transverse direction (Y-direction) of the release film 2. The adhesive films 3 may be disposed at the ends in the transverse direction (Y-direction) of the release film 2. In addition, a plurality of the adhesive films 3 may be arranged in the transverse direction (Y-direction) of the release film 2.

Figure 2:
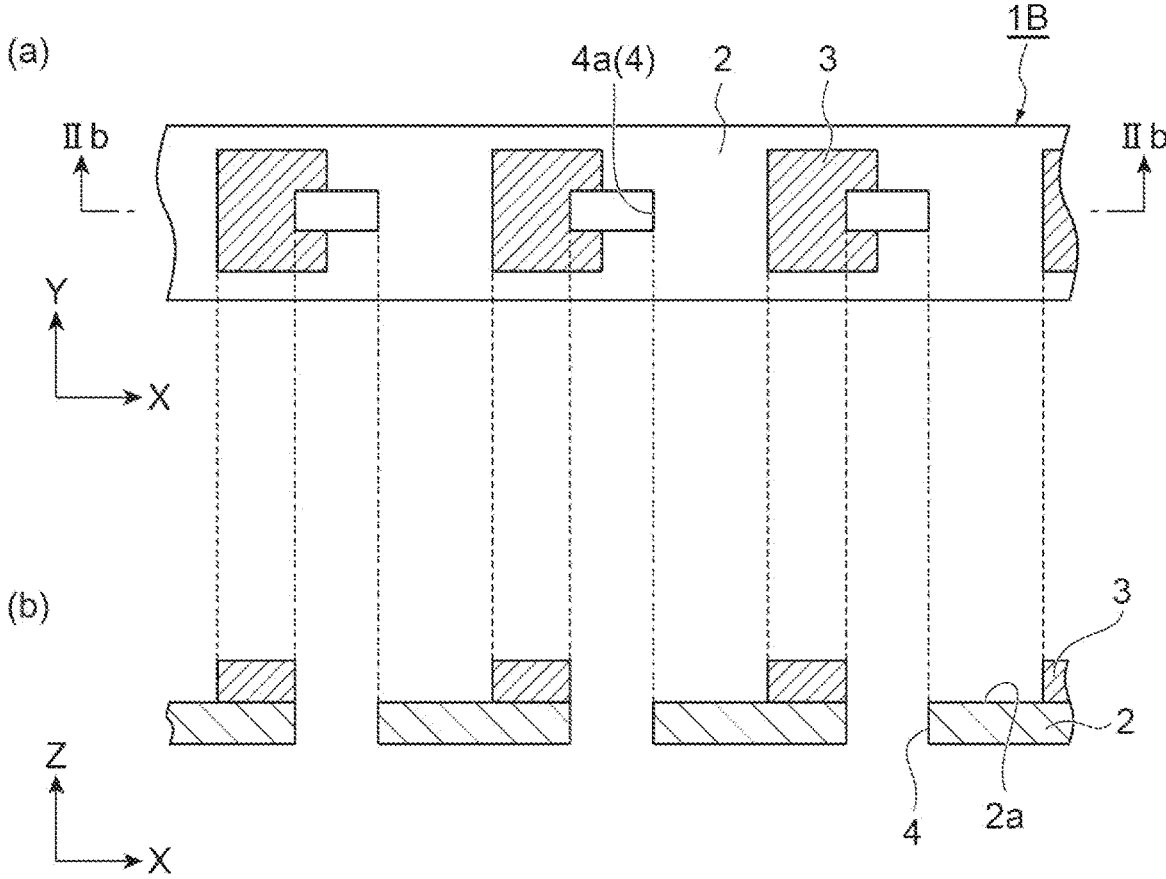
[FIG. 2] Part (a) of FIG. 2 is a plan view illustrating the adhesive sheet according to another embodiment, and part (b) of FIG. 2 is a schematic end view taken along line IIb-IIb shown in part (a) of FIG. 2.

In the above-described embodiment, the adhesive film 3 is formed continuously so as to surround the entire circumference of the opening 4a in the release film 2 when viewed from the thickness direction (Z-direction) of the release film 2; however, as is the case of the adhesive sheet 1B shown in part (a) and part (b) of FIG. 2, the adhesive film 3 may be formed so as to surround a portion of the opening 4a. In the present specification, even in a case where a portion of the opening 4a is surrounded by the adhesive film 3 in this way, when 5% or more of the entire circumference of the opening 4a is surrounded by the adhesive film 3, it is assumed that the adhesive film 3 is formed around the opening 4a.

Figure 3:
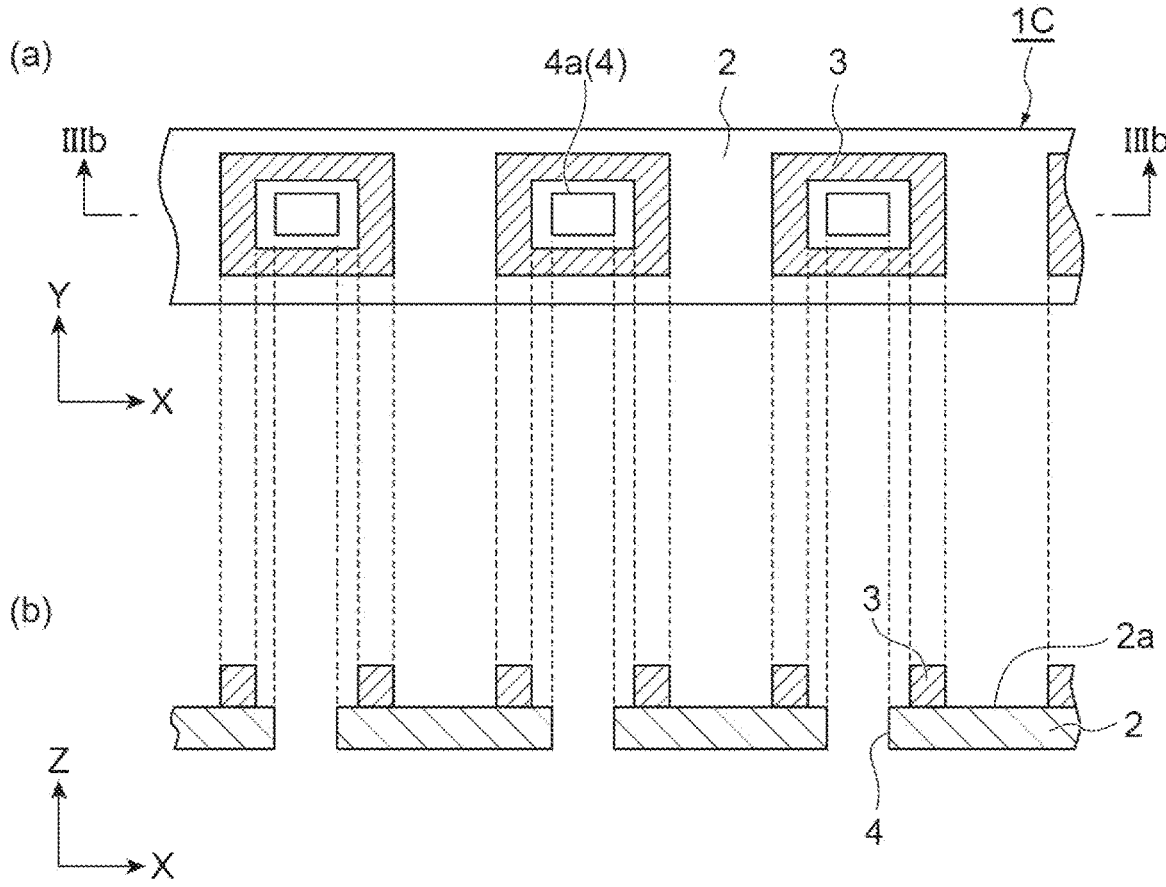
[FIG. 3] Part (a) of FIG. 3 is a plan view illustrating the adhesive sheet according to an embodiment, and part (b) of FIG. 3 is a schematic end view taken along line IIIb-IIIb shown in part (a) of FIG. 3.

Furthermore, in the above-described embodiment, the adhesive film 3 is formed such that the edges of the adhesive film 3 follow the edges of the opening 4a (that is, the edges of the adhesive film 3 and the edges of the opening 4a match); however, as is the case of the adhesive sheet 1C shown in part (a) and (b) of FIG. 3, the edges of the adhesive film 3 and the edges of the opening 4a do not have to match, and there may be regions where the adhesive film 3 does not exist in the area between the edges of the adhesive film 3 and the edges of the opening 4a. In the present specification, even in a case where the edges of the opening 4a and the edges of the adhesive film 3 do not match in this way, when the distance (shortest distance when viewed in a plan view) between the opening 4a and the adhesive film 3 is 5 mm or less, it is assumed that the adhesive film 3 is formed around the opening 4a. Although not shown in the drawing, in the above-described embodiment in which the edges of the opening 4a do not match the edges of the adhesive film 3, a portion of the edges of the opening 4a may match the edges of the adhesive film 3. Furthermore, even in the above-described embodiment in which the edges of the opening 4a do not match the edges of the adhesive film 3, the adhesive film 3 may be formed so as to surround a portion of the opening 4a.

Figure 4:
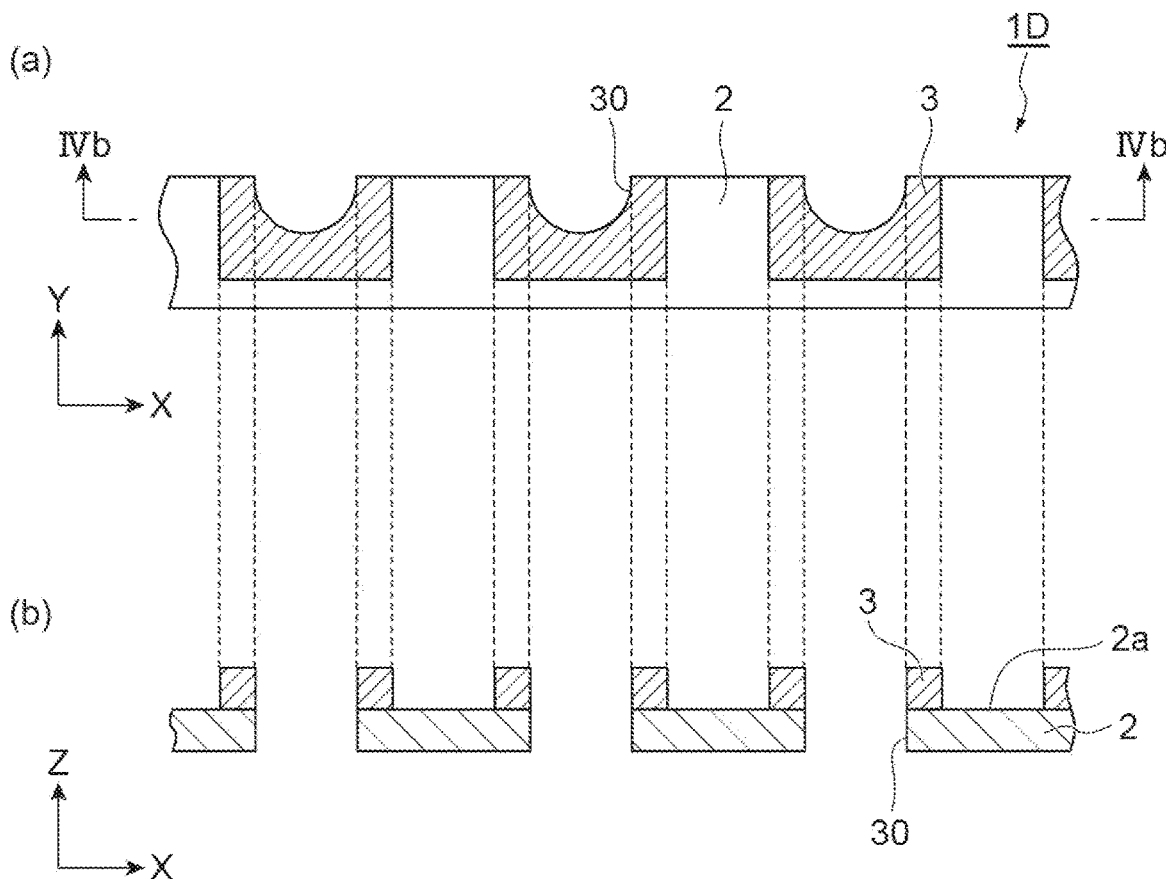
[FIG. 4] Part (a) of FIG. 4 is a plan view illustrating the adhesive sheet according to another embodiment, and part (b) of FIG. 4 is a schematic end view taken along line IVb-IVb shown in part (a) of FIG. 4.

In the above-described embodiment, the release film 2 has a through-hole 4; however, as is the case of the adhesive sheet 1D shown in part (a) and (b) of FIG. 4, the release film 2 may have a notch part 30 in a part of the peripheral edge portion of the release film, instead of the through-hole 4 (or in addition to the through-hole 4). In this case, the adhesive film 3 is formed around the notch part 30 when viewed in a plan view. As a result, even in a case where the adherend has a protruding part on the adhesive surface, the adhesive film 3 can be stuck to the periphery of the protruding part without attaching the adhesive to the protruding part, by positioning the adhesive sheet such that the notch part 30 is located around the protruding part when viewed in a plan view. The shape of the notch part 30 is not limited to a semi-circular shape, and may be another regular shape such as a quadrangular shape or a triangular shape or may be an irregular shape. In the same manner as in the case where the release film 2 has the through-hole 4, even in a case where the entire circumference of the notch part 30 is not surrounded by the adhesive film 3, when 5% or more of the entire circumference of the notch part 30 is surrounded by the adhesive film 3, it is assumed that the adhesive film 3 is formed around the notch part 30. Furthermore, even in a case where the edges of the notch part 30 do not match the edges of the adhesive film 3, when the distance (shortest distance when viewed in a plan view) between the notch part 30 and the adhesive film 3 is 5 mm or less, it is assumed that the adhesive film 3 is formed around the notch part 30.

In addition, in the adhesive film 3, a hole (through-hole) may be formed at a site different from the site above the through-hole 4 of the release film 2. In this case, the shape, size, and number of the holes are not particularly limited.

In the above-described embodiment, the outer shape (planar shape) of the adhesive film is a rectangular shape; however, the outer shape of the adhesive film may be a polygonal shape, a circular shape, an elliptical shape, or the like or may be an irregular shape. Furthermore, the shapes of a plurality of the adhesive film may be identical with or different from each other.

In the above-described embodiment, the adhesive film 3 is composed of one layer; however, the adhesive film 3 may be composed of multiple layers. The adhesive film 3 may include, for example, a conductive particle layer containing conductive particles and a conductive particle-free layer that does not contain conductive particles. In this case, the adhesive film 3 may be formed such that the conductive particle-containing layer is on the opposite side of the release film 2.

Production Method for Adhesive Sheet

A production method for an adhesive sheet according to an embodiment is a production method for an adhesive sheet for semiconductor device production including a release film and an adhesive film provided on the release film. The production method for an adhesive sheet includes: a preparation step of preparing a backing material-attached laminated body including a laminated body and a backing material, the laminated body including the release film and an adhesive film layer provided on the release film, and the backing material being stuck to the release film side of the laminated body; a laminated body cutting step of making an incision in the laminated body along any cut-out shape; and a backing material peeling step of peeling the backing material from the laminated body, in which in the backing material peeling step, a portion of the laminated body existing in a region surrounded by the incision is attached to the backing material and removed.

The incision in the laminated body cutting step may be formed at the central portion of the laminated body or may be formed so as to surround a portion of the peripheral edge of the laminated body. In a case where the incision is formed so as to surround a portion of the peripheral edge of the laminated body, a notch part is formed by cutting out and removing an area including a portion of the above-described peripheral edge in the backing material peeling step.

The production method for an adhesive sheet may include: an adhesive film layer cutting step of making an incision in the adhesive film layer along an outline forming an outer shape of the adhesive film; and a margin peeling step of peeling, from the release film, a portion other than the portion removed in the backing material peeling step, in the margin portion constituting the portion other than the adhesive film in the adhesive film layer.

According to the above method, the above-described adhesive sheet (for example, adhesive sheets 1A, 1B, 1C, and 1D) is obtained. Hereinafter, the production method for an adhesive sheet according to the embodiment will be described by taking the production method for the adhesive sheet 1A as an example.

Figure 5:
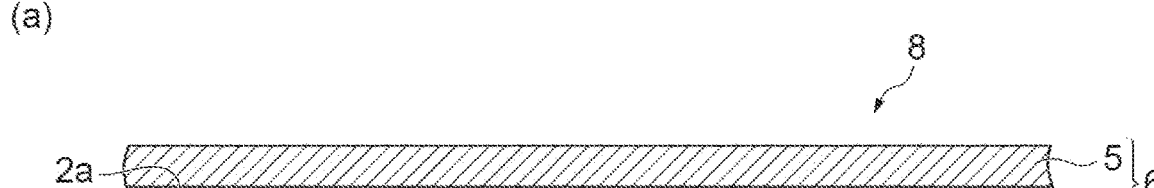
[FIG. 5]
Figure 5:
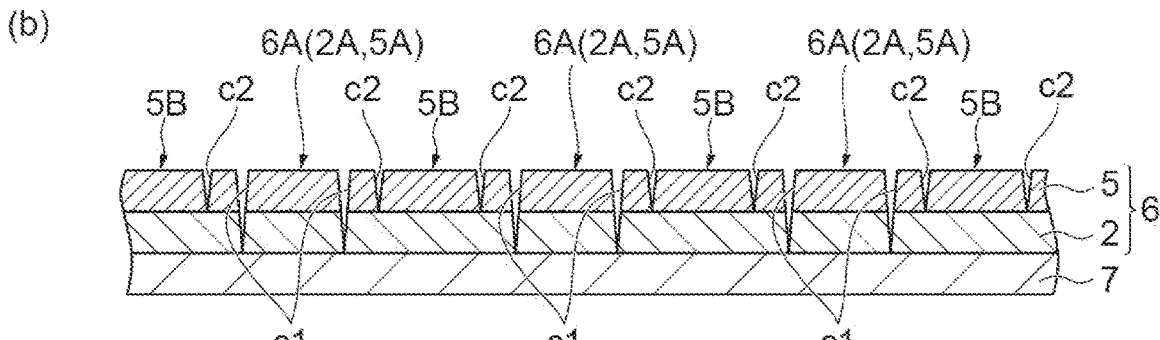
Figure 5:
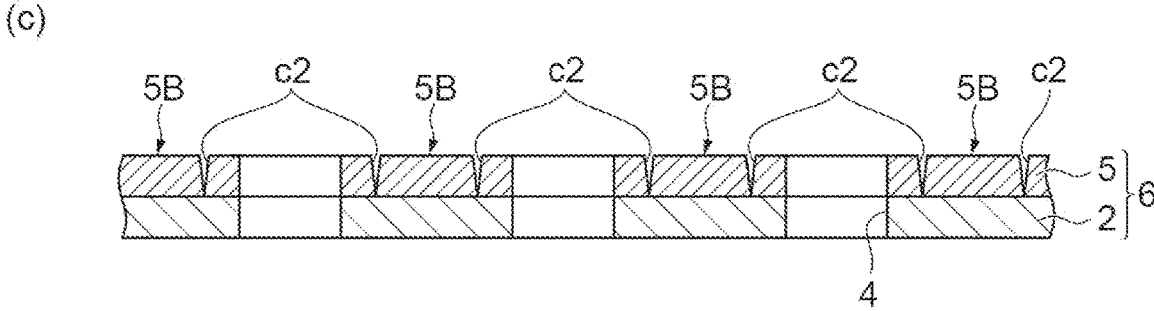
Figure 5:
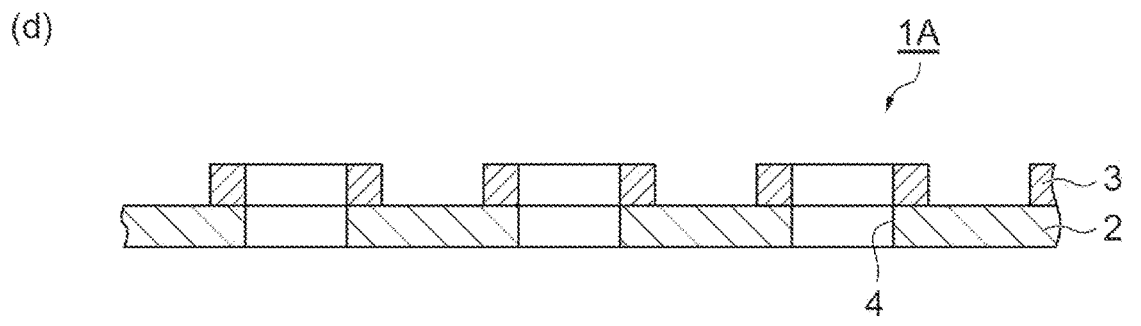
Figure 6:
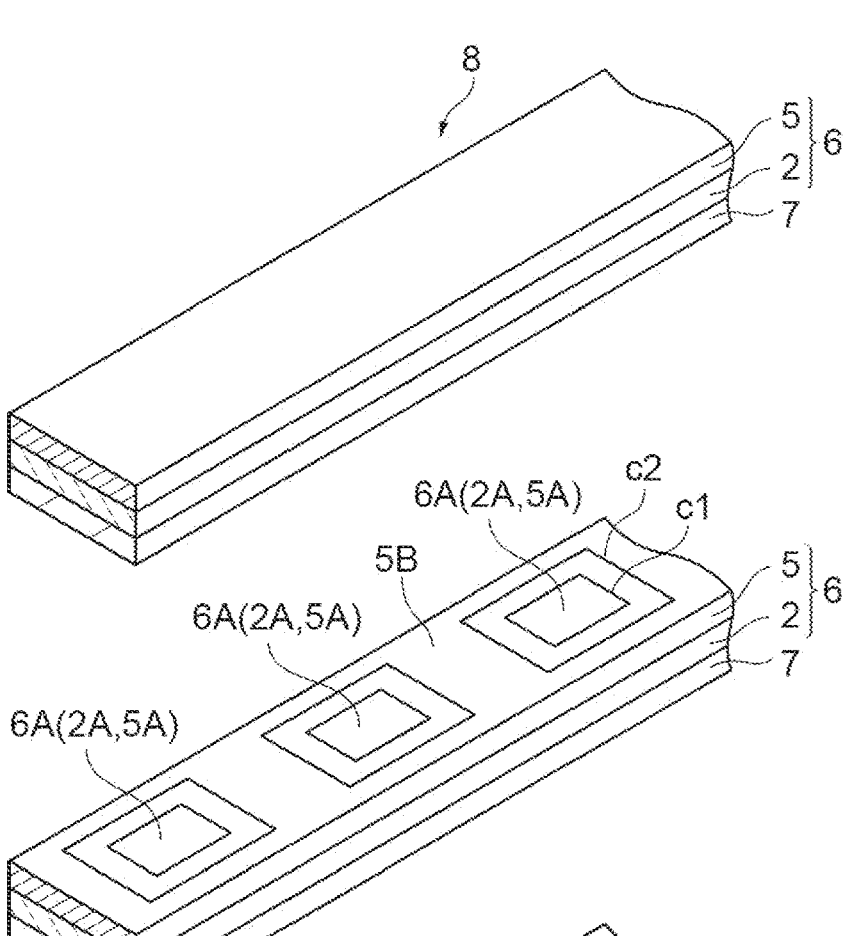
[FIG. 6]
Figure 6:
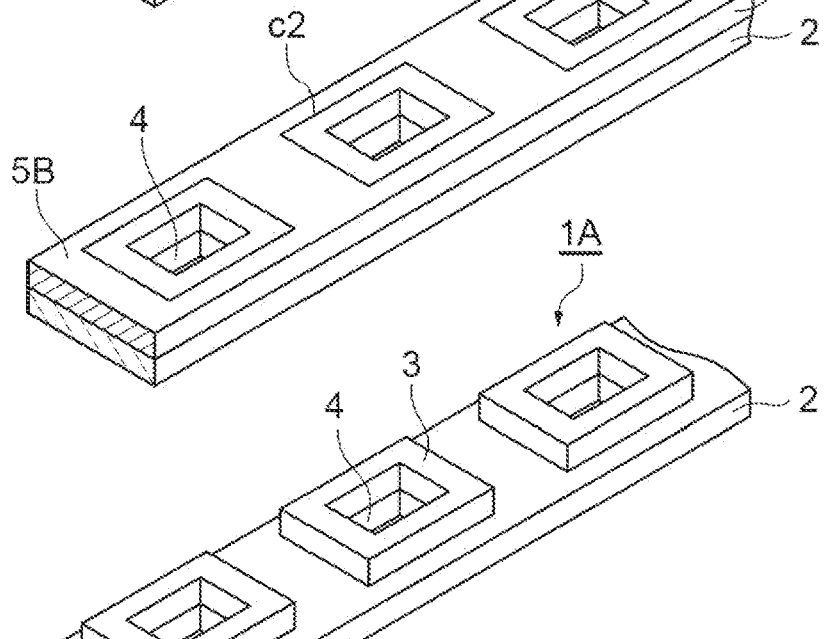

FIG. 5 is a schematic cross-sectional view for describing the production method for the adhesive sheet 1A, and FIG. 6 is a perspective view for describing the production method for the adhesive sheet 1A. The production method for the adhesive sheet 1A includes: a preparation step of preparing a backing material-attached laminated body 8 (see part (a) of FIG. 5 and part (a) of FIG. 6); a laminated body cutting step of making an incision (first incision) c1 in the laminated body 6 along any cut-out shape (see part (b) of FIG. 5 and part (b) of FIG. 6); an adhesive film layer cutting step of making an incision (second incision) c2 in the adhesive film layer 5 along an outline forming an outer shape of the adhesive film 3 (see part (b) of FIG. 5 and part (b) of FIG. 6); a backing material peeling step of peeling the backing material 7 from the laminated body 6 (see part (c) of FIG. 5 and part (c) of FIG. 6); and a margin peeling step of peeling, from the release film 2, a portion (peeled portion) 5B other than the portion removed in the backing material peeling step (adhesive film piece 5A), in the margin portion constituting the portion other than the adhesive film 3 in the adhesive film layer 5 (see part (d) of FIG. 5 and part (d) of FIG. 6). Each of the above-described steps will be described below.

(Preparation Step)

In the preparation step, a backing material-attached laminated body 8 is prepared. As shown in part (a) of FIG. 5 and part (a) of FIG. 6, the backing material-attached laminated body 8 includes a laminated body 6 and a backing material 7. The laminated body 6 includes a release film 2 and an adhesive film layer 5 provided on the release film 2. The adhesive film layer 5 is formed over, for example, the entirety of a principal surface 2a of the release film 2. The backing material 7 is stuck to the other principal surface 2b so as to cover the entirety of the principal surface 2b of the release film 2.

In the backing material 7, the principal surface on the side that is stuck to the release film 2 constitutes a surface that has tacky adhesiveness. Although not shown in the drawing, the backing material 7 is, for example, a tacky adhesive film including a resin film and a tacky adhesive layer formed on the resin film. The resin film is formed of, for example, polyethylene terephthalate (PET), polyethylene, polypropylene, or the like. The tacky adhesive layer is formed by using, for example, an acrylic resin, various synthetic rubbers, natural rubber, or a polyimide resin. The thickness of the backing material may be, for example, 20 to 100 mm.

The adhesive strength of the interface between the backing material 7 and the release film 2 in the backing material-attached laminated body 8 may be weaker than the adhesive strength of the interface between the adhesive film layer 5 and the release film 2, from the viewpoint of preventing the occurrence of peeling at the interface between the adhesive film layer 5 and the release film 2 in the backing material peeling step. For the adhesive strength of the interface between the backing material 7 and the release film 2 and the adhesive strength of the interface between the adhesive film layer 5 and the release film 2, a value measured by using an adhesive power tester (4000 Puls manufactured by Nordson Corporation) can be used. The adhesive strength of the interface between the backing material 7 and the release film 2 and the adhesive strength of the interface between the adhesive film layer 5 and the release film 2 can be adjusted by the type of the tacky adhesive layer of the backing material 7, the surface treatment for the principal surface 2a and the principal surface 2b of the release film 2, and the like.

The preparation step may be a step of producing the backing material-attached laminated body 8. For example, the preparation step may include: a step of forming the adhesive film layer 5 on one principal surface 2a of the release film 2; and a step of sticking the backing material 7 on the other principal surface 2b of the release film 2.

(Laminated Body Cutting Step)

In the laminated body cutting step, for example, the laminated body 6 is pressed against a roll cutter in which a cutting blade is formed on the outer peripheral surface. At this time, an incision c is made in the laminated body 6 from the adhesive film layer 5 side until the incision reaches to the backing material 7. As a result, a portion (removed portion) 6A existing in the region surrounded by the incision c1 is separated from the laminated body 6. The removed portion 6A is composed of a release film piece 2A and an adhesive film piece 5A. The incision c1 may be formed halfway through the backing material, so long as the backing material 7 is not cut. The cut-out shape (shape of the removed portion 6A) is a shape corresponding to the shape of the protruding part formed on the adhesive surface of the adherend, and is the same shape as the shape of the opening 4a of the through-hole 4 when viewed in a plan view.

(Adhesive Film Layer Cutting Step)

In the adhesive film layer cutting step, an incision c2 is made in the adhesive film layer 5 from the adhesive film layer 5 side until the incision reaches to the release film 2, in the same manner as in the laminated body cutting step. The incision c2 may be formed halfway through the release film so long as the release film 2 is not cut. The adhesive film layer cutting step may be carried out before or after the laminated body cutting step. Furthermore, for example, the adhesive film layer cutting step and the laminated body cutting step may be carried out simultaneously by adjusting the depth of the incision by using two kinds of cutting blades having different lengths.

(Backing Material Peeling Step)

In the backing material peeling step, the backing material 7 is peeled off from the release film 2 of the laminated body 6. At this time, since the release film piece 2A in the removed portion 6A separated from the laminated body 6 is in a state of being attached to the backing material 7, the release film piece 2A and the adhesive film piece 5A are removed together with the backing material 7.

(Margin Peeling Step)

In the margin peeling step, a peeled portion 5B (a portion other than the portion (adhesive film piece 5A) removed in the backing material peeling step in the margin portion constituting the portion other than the adhesive film 3 in the adhesive film layer 5) of the adhesive film layer 5 is peeled off from the release film 2. Peeling can be performed by, for example, sticking a tacky adhesive tape to the peeled portion 5B, pulling the tacky adhesive tape, and tearing off the peeled portion 5B from the release film 2. The margin peeling step may be carried out after the laminated body cutting step, or before or after the backing material peeling step, or may be carried out simultaneously with the backing material peeling step. Furthermore, the margin peeling step may also be carried out before the laminated body cutting step.

The production method for an adhesive sheet according to an embodiment has been described above; however, the production method for an adhesive sheet of the present disclosure is not limited to the above-described method. For example, according to another embodiment, the production method for an adhesive sheet does not have to include the adhesive film layer cutting step and the margin peeling step. Furthermore, with regard to the backing material-attached laminated body 8, the backing material 7 may be stuck to the other principal surface 2b of the release film 2 so as to include at least a region surrounded by the incision c1 in the principal surface 2b of the release film 2, or a portion of the other principal surface 2b of the release film 2 may be exposed.

Connected Structure and Production Method for Connected Structure

Figure 7:
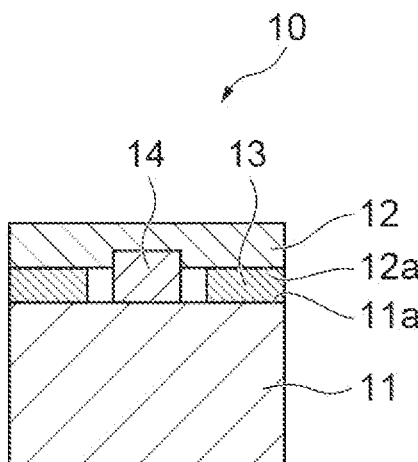
[FIG. 7]
Figure 8:
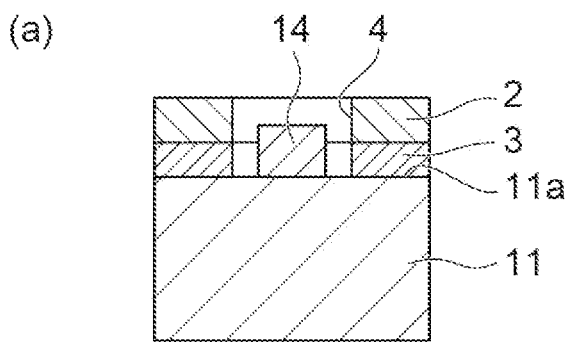
[FIG. 8]
Figure 8:
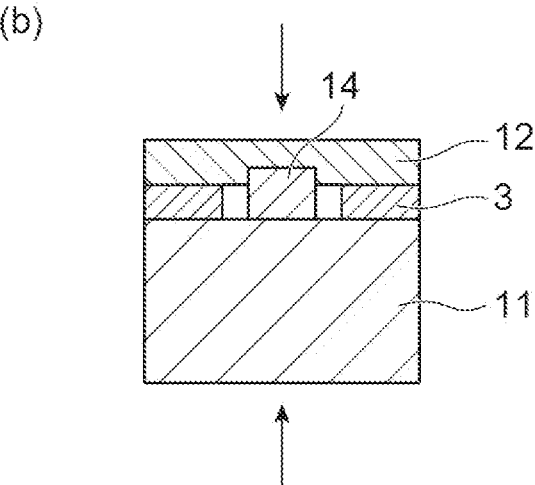
Figure 8:
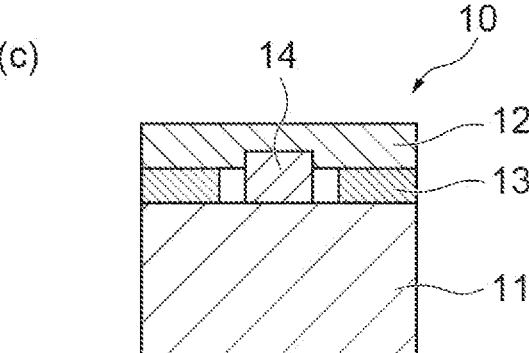

FIG. 7 is a schematic cross-sectional view illustrating a connected structure according to an embodiment, and FIG. 8 is a schematic cross-sectional view describing the production method for the connected structure in FIG. 7.

The connected structure 10 according to an embodiment includes: a first member 11 having a first adhesive surface 11a; a second member 12 having a second adhesive surface 12a; and a connecting part 13 formed from an adhesive film 3 or a cured product of the adhesive film 3, which connects the first adhesive surface 11a and the second adhesive surface 12a. The connected structure 10 is, for example, a semiconductor device or a component used for the production of a semiconductor device.

The first member 11 and the second member 12 are electronic components used for the production of a semiconductor device and are, for example, circuit members. The first member 11 may be a chip component of an IC chip, an LSI chip, a resistor chip, a capacitor chip, or the like. In this case, the second member 12 may be, for example, a circuit board and may be a substrate having optical transparency, such as a glass substrate, a polyimide substrate, a polyethylene terephthalate substrate, a polycarbonate substrate, a cycloolefin polymer (COP) substrate, a polyethylene naphthalate substrate, a glass-reinforced epoxy substrate, a paper phenol substrate, a ceramic substrate, or a laminated substrate.

In the first member 11, the surface facing the second member 12 constitutes the first adhesive surface 11a. Similarly, in the second member 12, the surface facing the first adhesive surface 11a of the first member 11 constitutes the second adhesive surface 12a. The first member 11 has a protruding part 14 such as a pillar, an IC, a protective film, a solder ball, or a multistage electrode on the first adhesive surface 11a. The protruding part 14 is connected to, for example, the second member 12. On the first adhesive surface 11a, a first electrode (not shown in the drawing) for electrical conduction with the second member 12 may be disposed. In this case, on the second adhesive surface 12a, a second electrode (not shown in the drawing) for electrical conduction with the first member 11 may be disposed.

There is no clear distinction between the first member 11 and the second member 12. As the first member 11, for example, a substrate having optical transparency, such as a glass substrate, a polyimide substrate, a polyethylene terephthalate substrate, a polycarbonate substrate, a cycloolefin polymer (COP) substrate, a polyethylene naphthalate substrate, a glass-reinforced epoxy substrate, a paper phenol substrate, a ceramic substrate, or a laminated substrate may be used, and as the second member 12, for example, a chip component such as an IC chip, an LSI chip, a resistor chip, or a capacitor chip may be used, or a circuit forming material such as a flexible wiring board may be used.

The connecting part 13 is formed at least around the above-described protruding part 14 when viewed in a plan view and connects (adheres) the first adhesive surface 11a and the second adhesive surface 12a. Here, the connecting part 13 being formed around the protruding part 14 means that the distance (shortest distance when viewed in a plan view) between the connecting part 13 and the protruding part 14 is 5 mm or less. The peripheral edge of the connecting part 13 and the peripheral edge of the protruding part 14 may coincide with each other; however, the distance (shortest distance when viewed in a plan view) between the connecting part 13 and the protruding part 14 may be 1 mm or more, so that the adhesive component constituting the connecting part 13 is not attached to the surface of the protruding part 14. In a case where the adhesive film 3 is a conductive adhesive film containing conductive particles, when the connecting part 13 is interposed between the first electrode of the first adhesive surface 11a and the second electrode of the second adhesive surface 12a, the first electrode of the first adhesive surface 11a and the second electrode of the second adhesive surface 12a may be electrically connected to each other by means of the conductive particles.

The production method for the connected structure 10 includes: a preparation step of preparing an adhesive sheet; a transfer step of sticking the adhesive film 3 of the adhesive sheet to the first adhesive surface 11a of the first member 11; and a connection step of connecting the first adhesive surface 11a of the first member 11 and the second adhesive surface 12a of the second member 12, with the adhesive film 3 interposed therebetween. As the adhesive sheet, the adhesive sheets of the present disclosure (adhesive sheets 1A, 1B, 1C, 1D, and the like) can be used.

In a case where the release film of the adhesive sheet has a through-hole, in the transfer step, positioning of the adhesive sheet may be performed such that the opening of the above-described through-hole in the release film and the protruding part 14 in the first member 11 are superposed when viewed in a plan view, and the adhesive sheet may be stuck to the first adhesive surface 11a of the first member 11 from the adhesive film 3 side (see part (a) of FIG. 8). As a result, the protruding part 14 formed on the first adhesive surface 11a of the first member 11 can be exposed through the through-hole 4 of the release film 2, and the adhesive film 3 can be stuck around the protruding part 14 without attaching the adhesive film 3 to the protruding part 14. In addition, although not shown in the drawing, in a case where the release film of the adhesive sheet has a notch part, in the transfer step, positioning of the adhesive sheet may be performed such that the notch part is located around the above-described protruding part 14 when viewed in a plan view, and the adhesive sheet may be stuck to the first adhesive surface 11a of the first member 11 through the adhesive film 3 side. As a result, the adhesive film 3 can be stuck around the protruding part 14 without attaching the adhesive film 3 to the protruding part 14.

Positioning can be performed by, for example, detecting the position of the adhesive film 3 in the adhesive sheet by using an image pick-up device. At this time, the image pick-up device may be disposed on the adhesive film 3 side or may be disposed on the release film 2 side. In the case of using a release film 2 having optical transparency, the image pick-up device can be disposed on the release film 2 side.

In the connection step, for example, after the release film 2 is peeled off from the adhesive film 3, the surface of the adhesive film 3 on the opposite side from the first member 11 and the second adhesive surface 12*a* of the second member 12 are stuck together (see part (b) of FIG. 8). Next, the first member 11 and the second member 12 are pressurized in the opposing directions (directions indicated by arrows in part (b) of FIG. 8). In a case where the adhesive film 3 has thermosetting properties, the adhesive film 3 is cured by both heating and pressurizing (see part (c) of FIG. 8). As a result, the first adhesive surface 11*a* of the first member 11 and the second adhesive surface 12*a* of the second member 12 are firmly connected, and the connected structure 10 is obtained. In a case where the adhesive film 3 has photocurability, the adhesive film 3 can be cured by performing both light irradiation and pressurizing. Depending on the type of the adhesive film 3, a step for curing after bonding together is not necessarily essential.

Roll

A roll according to an embodiment includes an adhesive sheet. As the adhesive sheet, the adhesive sheets of the present disclosure (adhesive sheets 1A, 1B, 1C, 1D, and the like) can be used. Hereinafter, the roll according to the embodiment will be described by taking a roll including the adhesive sheet 1A as an example.

Figure 9:
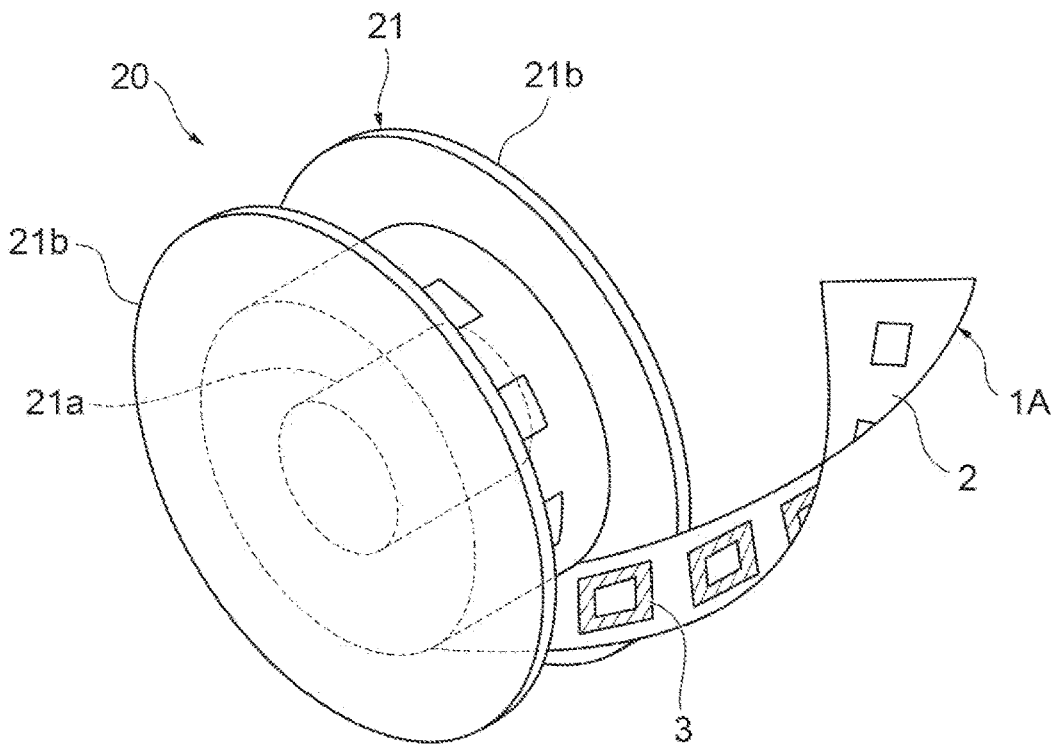
[FIG. 9]

FIG. 9 is a perspective view illustrating a roll including the above-described adhesive sheet 1A. As shown in FIG. 9, the roll 20 includes a long adhesive sheet 1A and a winding core 21 around which the adhesive sheet 1A is wound. That is, the roll 20 is formed by winding the adhesive sheet 1A around the winding core 21.

The winding core 21 includes a core material 21*a* and a pair of side plates 21*b*. The core material 21*a* is formed in a cylindrical shape. The adhesive sheet 1A is wound around the outer peripheral surface of the core material 21*a*. The pair of side plates 21*b* are attached to both end parts in the axial direction of the core material 21*a*. The pair of side plates 21*b* support the adhesive sheet 1A in the left-to-right direction. The distance between the pair of side plates 21*b* is slightly wider than the width of the adhesive sheet 1A.

REFERENCE SIGNS LIST

1A, 1B, 1C, 1D: adhesive sheet, 2: release film, 2A: release film piece, 3: adhesive film, 4: through-hole, 4*a*: opening, 5: adhesive film layer, 5A: adhesive film piece, 5B: peeled portion, 6: laminated body, 6A: removed portion, 7: backing material, 8: backing material-attached laminated body, 10: connected structure, 11: first member, 11*a*: first adhesive surface, 12: second member, 12*a*: second adhesive surface, 13: connecting part, 14: protruding part, 20: roll. 21: winding core, 30: notch part.

The invention claimed is:

1. A production method for an adhesive sheet for semiconductor device production comprising a release film and an adhesive film provided on the release film, the production method comprising:

a preparation step of preparing a backing material-attached laminated body comprising a laminated body and a backing material, the laminated body comprising the release film and an adhesive film layer provided on the release film, and the backing material being stuck to the release film side of the laminated body;

a laminated body cutting step of making an incision in the laminated body along any cut-out shape; and a backing material peeling step of peeling the backing material from the laminated body, wherein in the backing material peeling step, a portion of the laminated body existing in a region surrounded by the incision is attached to the backing material and removed.

2. The production method for an adhesive sheet according to claim 1, further comprising:

an adhesive film layer cutting step of making an incision in the adhesive film layer along an outline forming an outer shape of the adhesive film; and a margin peeling step of peeling, from the release film, a portion other than the portion removed in the backing material peeling step, in a margin portion constituting a portion other than the adhesive film in the adhesive film layer.

3. The production method for an adhesive sheet according to claim 1, wherein the adhesive film is a conductive adhesive film comprising conductive particles.

4. The production method for an adhesive sheet according to claim 1, wherein the incision in the laminated body along any cut-out shape is made to cut through the laminated body comprising the adhesive film and the release film, but not completely through the backing material.

5. A production method for a connected structure, the production method comprising:

a preparation step of preparing an adhesive sheet, the adhesive sheet comprising a release film having a through-hole penetrating in a thickness direction, and an adhesive film provided on one principal surface of the release film, wherein the adhesive film is formed around an opening on the principal surface side of the through-hole such that the opening is exposed when viewed from the thickness direction, wherein the preparation step comprises:

preparing a backing material-attached laminated body comprising a laminated body and a backing material, the laminated body comprising the release film and an adhesive film layer provided on the release film, and the backing material being stuck to the release film side of the laminated body, wherein the laminated body has an incision along any cut-out shape; and a backing material peeling step of peeling the backing material from the laminated body, wherein, in the backing material peeling step, a portion of the laminated body existing in a region surrounded by the incision is attached to the backing material and removed;

a transfer step of sticking the adhesive film of the adhesive sheet to a first adhesive surface of a first member; and a connection step of connecting the first adhesive surface of the first member and a second adhesive surface of a second member, with the adhesive film interposed therebetween, wherein the first member has a protruding part on the first adhesive surface, and in the transfer step, positioning of the adhesive sheet is performed such that the opening in the release film and the protruding part in the first member are superposed when viewed in a plan view, and sticking the adhesive film to the first adhesive surface of the first member such that the adhesive film is not attached to the protruding part.

6. The production method for a connected structure according to claim 5, wherein the incision in the laminated body along any cut-out shape is made to cut through the laminated body comprising the adhesive film and the release film, but not completely through the backing material.

7. The production method for a connected structure according to claim 5, wherein the adhesive film is a conductive adhesive film comprising conductive particles.

8. A production method for a connected structure, the production method comprising:
a preparation step of preparing an adhesive sheet, the adhesive sheet comprising a release film having a notch part in a part of a peripheral edge portion, and an adhesive film provided on one principal surface of the release film, wherein the adhesive film is formed around the notch part when viewed from the thickness direction, wherein the preparation step comprises:
preparing a backing material-attached laminated body comprising a laminated body and a backing material, the laminated body comprising the release film and an adhesive film layer provided on the release film, and the backing material being stuck to the release film side of the laminated body, wherein the laminated body has an incision along any cut-out shape; and
a backing material peeling step of peeling the backing material from the laminated body, wherein, in the backing material peeling step, a portion of the laminated body existing in a region surrounded by the incision is attached to the backing material and removed;
a transfer step of sticking the adhesive film of the adhesive sheet to a first adhesive surface of a first member; and
a connection step of connecting the first adhesive surface of the first member and a second adhesive surface of a second member, with the adhesive film interposed therebetween,
wherein the first member has a protruding part on the first adhesive surface, and
in the transfer step, positioning of the adhesive sheet is performed such that the notch part in the release film is located around the protruding part in the first member when viewed in a plan view, and sticking the adhesive film to the first adhesive surface of the first member such that the adhesive film is not attached to the protruding part.

9. The production method for a connected structure according to claim 8, wherein the incision in the laminated body along any cut-out shape is made to cut through the laminated body comprising the adhesive film and the release film, but not completely through the backing material.

10. The production method for a connected structure according to claim 8, wherein the adhesive film is a conductive adhesive film comprising conductive particles.

* * * * *